United States Patent [19]
Chiu

[11] Patent Number: 5,832,596
[45] Date of Patent: Nov. 10, 1998

[54] METHOD OF MAKING MULTIPLE-BOND SHELF PLASTIC PACKAGE

[75] Inventor: Anthony Man-Chong Chiu, Richardson, Tex.

[73] Assignee: STMicroelectronics, Inc., Carrollton, Tex.

[21] Appl. No.: 777,635

[22] Filed: Dec. 31, 1996

[51] Int. Cl.⁶ .................................................. H05K 3/36
[52] U.S. Cl. ................................ 29/830; 29/852; 427/96; 427/97
[58] Field of Search ........................ 29/830, 852; 427/96, 427/97

[56] References Cited

U.S. PATENT DOCUMENTS

| | | |
|---|---|---|
| 3,516,156 | 6/1970 | Steranko .................................... 29/830 |
| 4,644,643 | 2/1987 | Sudo ......................................... 29/830 |
| 4,668,332 | 5/1987 | Ohnuki et al. ......................... 29/852 X |
| 4,991,285 | 2/1991 | Shaheen et al. ........................... 29/830 |
| 5,046,238 | 9/1991 | Daigle et al. .............................. 29/830 |
| 5,051,216 | 9/1991 | Madou et al. ......................... 29/830 X |

FOREIGN PATENT DOCUMENTS

| | | | |
|---|---|---|---|
| 3240754 | 5/1983 | Germany .................................. 29/830 |
| 3423181 | 1/1986 | Germany .................................. 29/830 |

*Primary Examiner*—Carl J. Arbes
*Attorney, Agent, or Firm*—Theodore E. Galanthay; Kenneth C. Hill; Lisa K. Jorgenson

[57] ABSTRACT

A method for forming a package for an integrated circuit in which a plurality of conduction paths are formed on a first board and on a second board. Holes are formed in the first board and the second board wherein the holes are adapted for receiving pins. The holes are aligned and the first board is coupled to the second board using an adhesive.

19 Claims, 10 Drawing Sheets

METHOD OF MAKING MULTIPLE-BOND SHELF PLASTIC PACKAGE

BACKGROUND OF THE INVENTION

1. Technical Field

The present invention relates generally to electronic integrated circuit devices and in particular to packaging of electronic integrated circuit devices. Still more particularly, the present invention relates to an improved method for manufacturing Plastic Pin Grid Array and Ball Grid Array packages that require multiple bond shelves.

2. Description of the Related Art

Printed wiring boards (PWBs) are employed to interconnect devices and components in a large number of electronic products. A printed wiring board (PWB) is a panel with repeated patterns from which printed circuit boards (PCBs) are cut to provide the physical structure for mounting and holding electronic components as well as the electrical interconnection between components. A PWB typically consists of a non-conducting substrate (typically fiberglass with epoxy resin) upon which a conductive pattern or circuitry is formed. Copper is the most prevalent conductor, although nickel, silver, tin, tin-lead, and gold also may be used as etch-resist or top level metal. Packages include single-sided, double-sided, and multilayer PCBs. Single-sided boards have a conductive pattern on only one side, double-sided boards have conductive patterns on both faces, and multi-layer boards consist of alternating layers of conductor and insulating material bonded together. The conductive layers are connected by plated through-holes, which are also used to mount and electrically fix components. PWBs may be either rigid, flexible, or a combination of the two.

PWBs are used in plastic pin grid array (PPGA) and ball grid array (BGA) packages. These packages are used to package integrated circuits, such as microprocessors. In some cases, these packages employ multiple bond shelves. FIGS. 1A–1C show top and partial cross-sectional views of packages with different numbers of bond shelves formed from stacking PCBs known in the art. In particular, FIG. 1A shows a single bond shelf package. Package 100 includes a hole 102 with a wire bonding region 104. An integrated circuit, such as a microprocessor, may be mounted within hole 102 for electrical connection to wire bonding region 104. Board 101 includes a signal layer 106 and a power layer 108 over a core 110. A prepreg layer 107 is located between signal layer 106 and power layer 108. Beneath core 110 is a ground layer 112 and a signal layer 114. A prepreg layer 109 is located between ground layer 112 and signal layer 114. A solder mask 111 is placed on signal layer 106, and a solder mask 113 is placed under signal layer 114. Bonding region 104 is formed by the exposed portion of signal layer 106 and 112.

In FIG. 1B, a package with a two bond-shelf architecture is illustrated. Package 116 contains a hole 118 in which an integrated circuit, such as a microprocessor, will be mounted for connection to package 116 through wire bonding regions 120 and 122. Board 115 includes solder mask 121, signal layer 124, core 126, power layer 128, and solder mask 123. Board 117 includes solder mask layer 127, power layer 130, core 132, ground layer 134, and solder mask 129. Board 117 is bonded to board 115 by prepeg layer 125. The exposed regions of signal layer 124 form bonding region 122. Ground layer 134 wraps around the cavity, to the level of layer 130, and forms the bonding area 120.

In FIG. 1C, package 140 includes a hole 142 with wire bonding regions 144, 146, and 148. Again, an integrated circuit may be mounted within hole 142 for electrical connection to wire bonding regions 144, 146, and 148. Board 141 includes solder mask 147, signal layer 150, core 152, signal layer 154, and solder mask 149. The exposed portion of signal layer 150 forms bonding region 148. Board 143 includes solder mask 153, signal layer 156, core 158, power layer 160, and solder mask 155. Board 141 is bonded to board 143 by prepeg layer 151. Board 145 includes solder mask 159, signal layer 162, core layer 164, ground layer 166, and solder mask 161. Board 145 is bonded to board 143 by prepeg layer 157. The exposed portion of signal layer 156 forming bonding region 146. Exposed portions of signal layer 162 forming wire bonding region 144. Ground layer 166 wraps around core layer 164, to the level of signal 162 and forms the bonding region 144.

In creating packages for integrated circuits using PCBs with multiple shelves, a first PCB, also referred to as a "board", is created by forming a photoresist layer on a board and exposing it. Then, lines are etched in the board and a hole is cut out for the die that contains the integrated circuit device. A second board is created in the same manner as the first board but with a bigger hole for the bond shelf step. The first and second boards are then placed together using lamination and prepreg, which is pre-impregnated fiberglass cloth known in the industry. Thereafter, the boards are heated or baked to cure the prepreg. Additionally, pressure is applied using a clamp during the curing process.

The problem with boards employing multiple shelves is that they tend to bow and resin from prepreg can outflow into the wire bonding regions during the placement of the boards together using heat and pressure. The present solution to this problem involves the use of a special tool. Turning to FIG. 2, a diagram illustrating the use of a special tool presently employed for creating boards with multiple steps is depicted. Packages 200 include boards 202 and 204 in the depicted example. A hole 208 is found between these boards. Each board includes various power, ground, and signal layers not shown in this example. Prepreg 212 is placed between solder masks 214 and 216 on boards 202 and 204 with pressure being applied to the boards by clamp 218. Tool 220 is an insert used in stepped hole 208 to prevent bowing when heating of the boards occurs. A problem exists, however, when different numbers of steps and hole sizes are employed for different integrated circuits. Consequently, a different insert may be required for each type of integrated circuit having different dimensions. The use of this tool in the presently known method increases the complexity and cost of manufacturing and packaging integrated circuit devices.

Therefore, it would be advantageous to have an improved method for manufacturing packages for integrated circuit devices.

SUMMARY OF THE INVENTION

The present invention provides a method for forming a package for an integrated circuit device in which a plurality of conduction paths are formed on a first board and on a second board. Holes are formed in the first board and the second board wherein the holes are adapted for receiving pins. The holes are aligned and the first board is coupled to the second board using an adhesive.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1A:
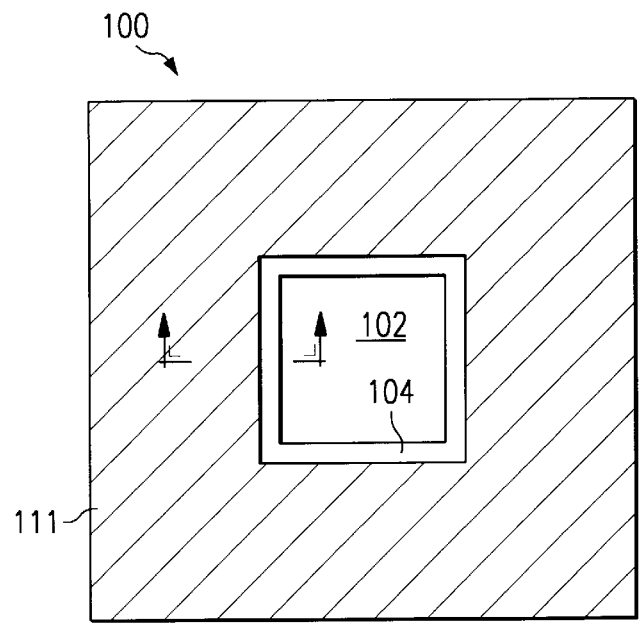
FIGS. 1A–1C show top and partial cross-sectional views of printed wiring boards with different numbers of bond shelves known in the art.
Figure 1A:
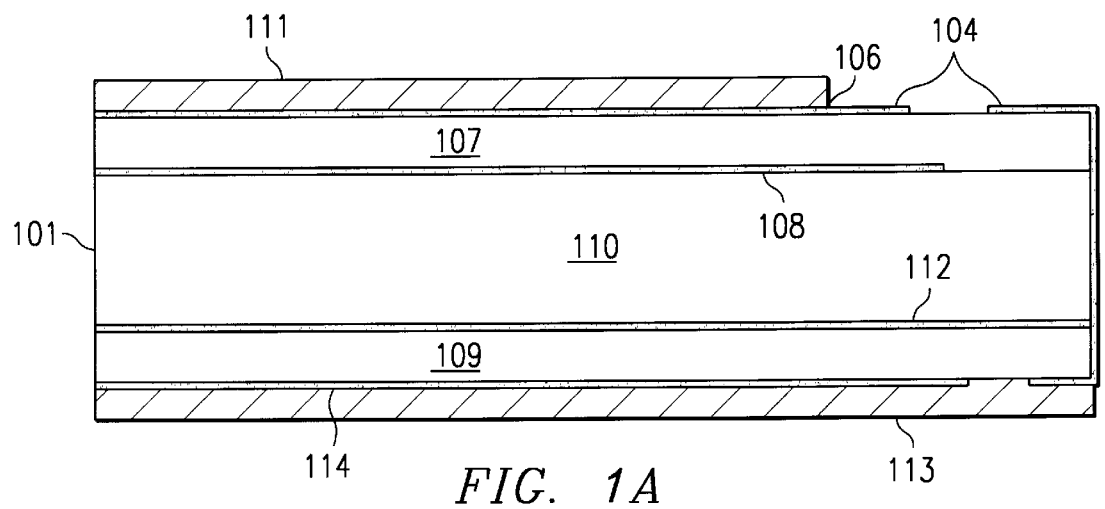
Figure 1B:
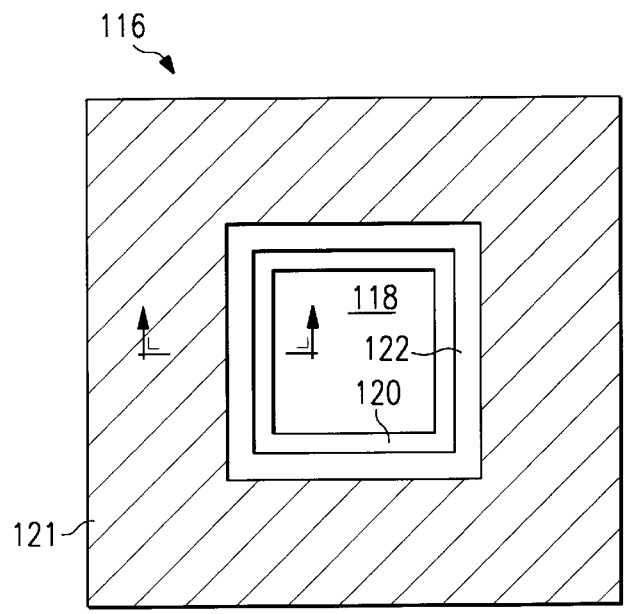
Figure 1B:
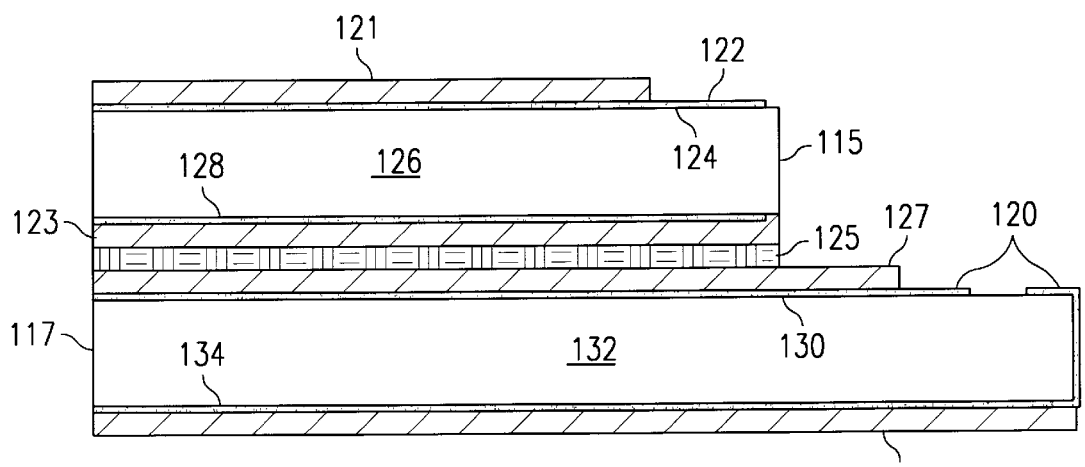
Figure 1C:
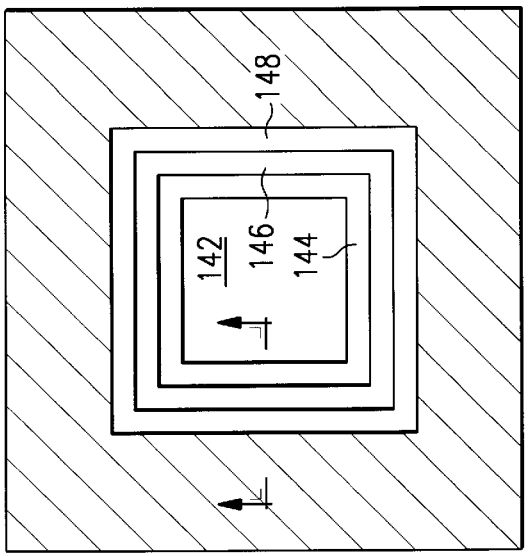
Figure 1C:
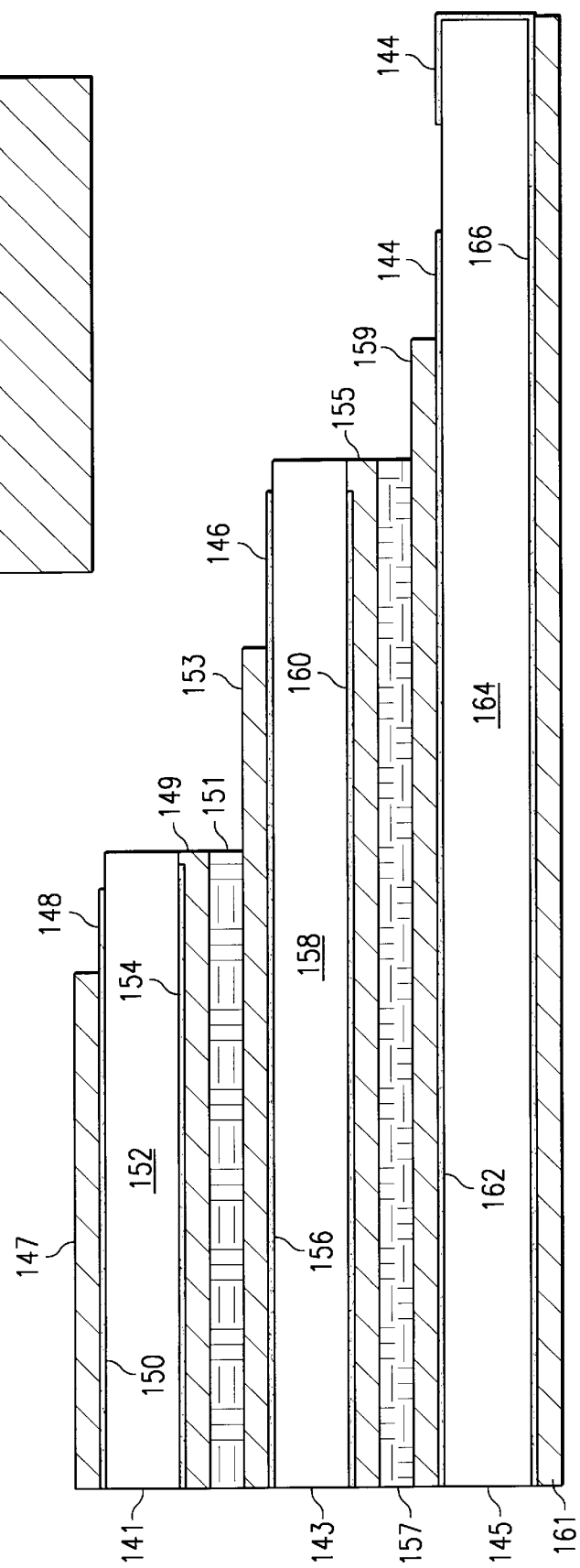
Figure 2:
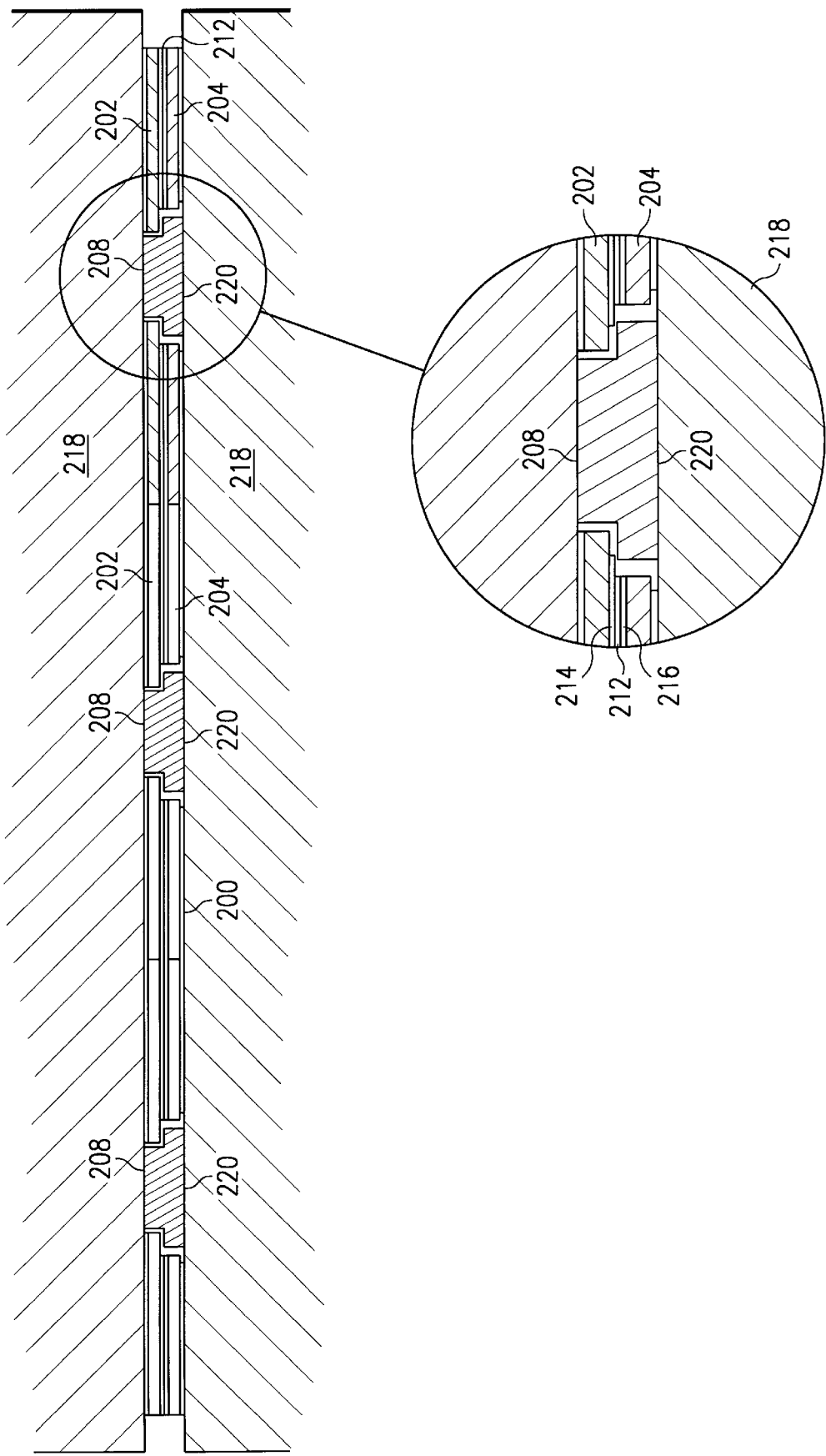
FIG. 2 depicts a diagram illustrating the use of a special tool presently employed for creating packages with multiple steps.
Figure 3A:
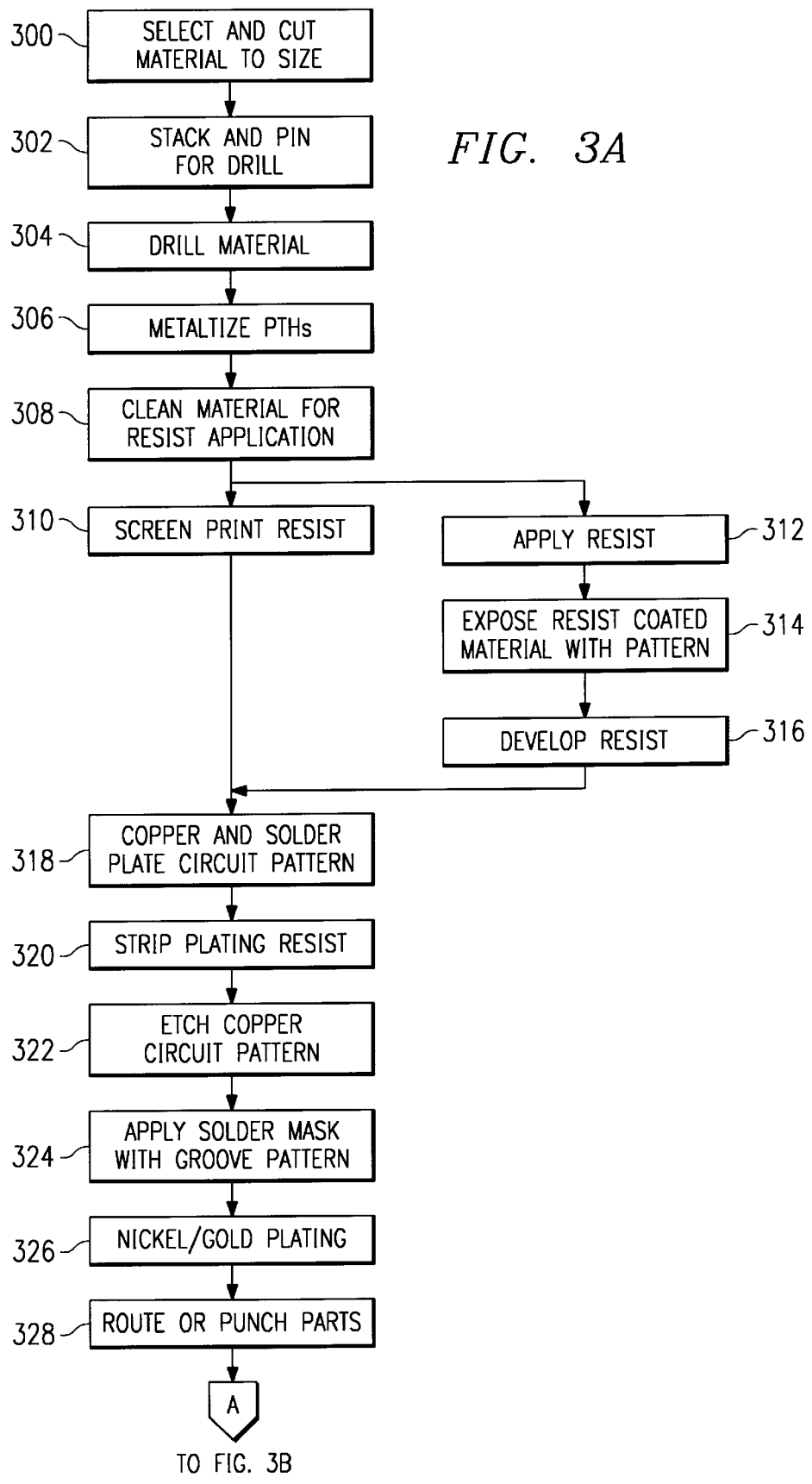
FIGS. 3A and 3B depict a flowchart of a process used to form a package in accordance with an illustrative embodiment of the present invention.
Figure 3B:
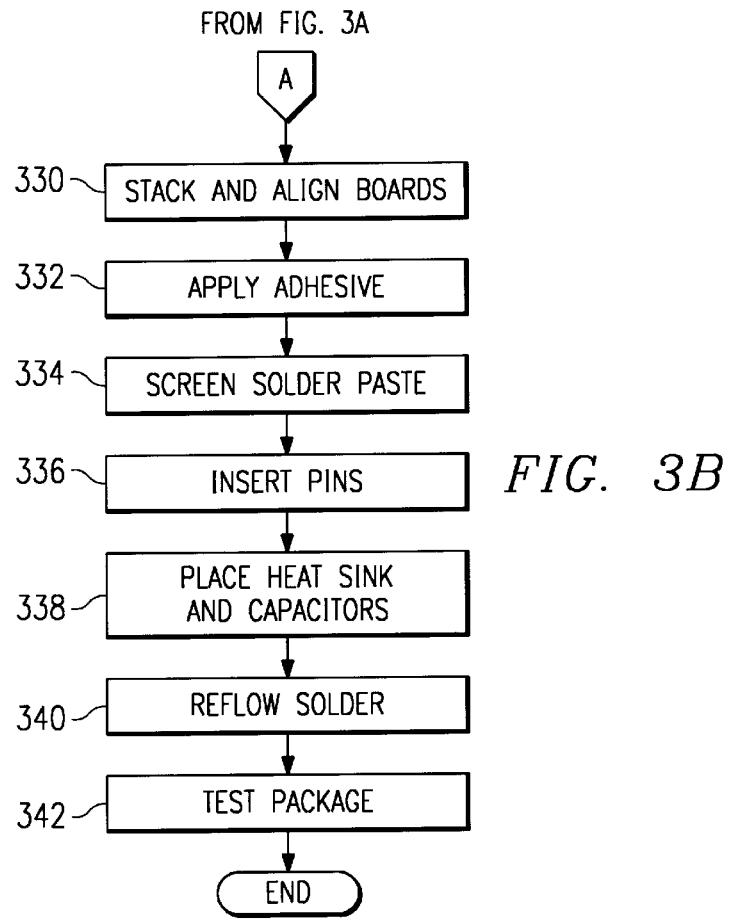
Figure 3C:
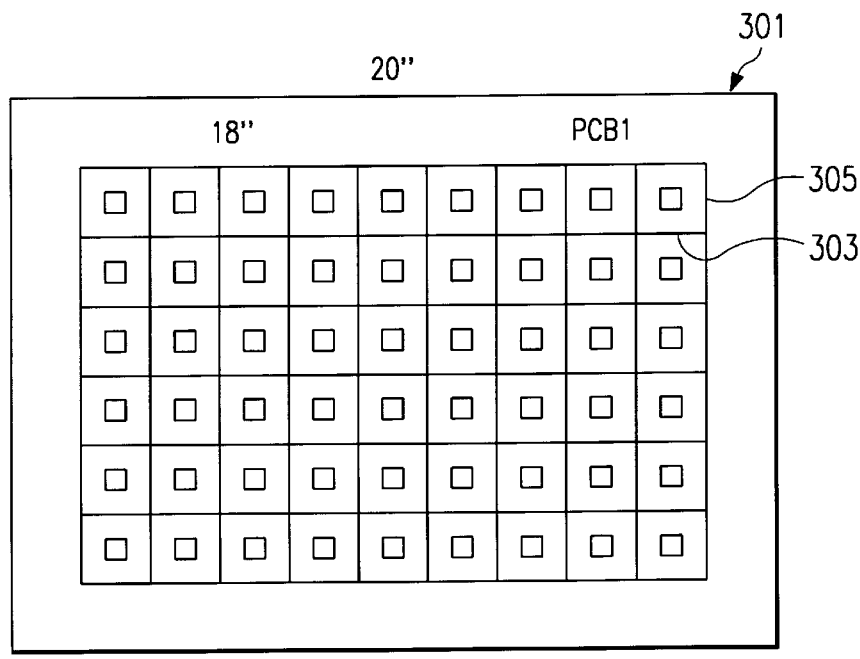
FIG. 3C is an illustration of a printed wire board panel.

With reference now to FIGS. 3A and 3B, a flowchart of a process used to form a package is depicted in accordance with an illustrative embodiment of the present invention. The process begins by the manufacturing of panels containing the first boards, also called "bond shelf pieces". In FIG. 3C, a diagram of a printed wire board panel 301 containing a number of boards 305 is depicted.

The process begins by selecting and cutting the material used to form the boards to the correct size (step 300). Thereafter, the material is stacked and pinned for drilling (step 302). For example, a number of PWB panels 301 may be stacked and drilled. The material is then drilled to form holes (step 304). For PWB panels that will contain signal layers, only holes for pins are drilled. In PWBs that will contain power and ground planes, a hole such as hole 305 in FIG. 3C, is cut out for wrap around plating. Metallization of PTHs (plated through holes) is performed (step 306). The material is then cleaned for application of resist (step 308).

Thereafter, the resist may be screen printed (step 310) or alternatively, the resist may be applied (step 312) with the resist then being exposed using a mask with a selected pattern (step 314). After exposure, the resist is developed (step 316). Next, the circuit pattern formed by developing the resist is copper and solder plated (step 318). After the plating, the resist is stripped from the board (step 320), and the copper circuit pattern is etched (step 322). Steps 300 through steps 322 are typical double-sided PWB processing steps. Next, a solder mask including a groove pattern is applied in accordance with an illustrative embodiment of the present invention (step 324). Thereafter, nickel/gold plating occurs (step 326) and then routing or punching of the PWB occurs (step 328). In step 328, PWB panel 301 is cut into smaller pieces 303 to form PCBs, also referred to as "boards". Steps 300 through 328 are employed to create other PWBs with signal layers or other PWBs with power and ground planes.

The signal layer and power/ground layer boards are stacked up according to the design being implemented and are aligned (step 330). Next, adhesive is applied to glue the boards together (step 332). In the depicted example, adhesive only needs to be applied in areas near regions where wire bonding will occur. Adhesive may be applied in other areas, but is not required. The alignment may be formed by placing pins within some of the holes and aligning the boards with the pins. Thereafter, solder paste is screened onto the appropriate places on the boards (step 334). The remaining pins are then inserted (step 336) and a heat sink and capacitors are placed within the hole (step 338). Then, the solder is reflowed (step 340) and the package is tested for opens and shorts (step 342).

Alternatively, alignment may be performed using a pin base. Additionally, adhesive and solder paste may be applied at the same time when the pieces are aligned and put together. The steps depicted in FIGS. 3A, 3B, and 3C are used to form a package containing two boards. Additional boards may be employed using the steps illustrated above to form packages with more than two boards in accordance with an illustrative embodiment of the present invention.

Figure 4:
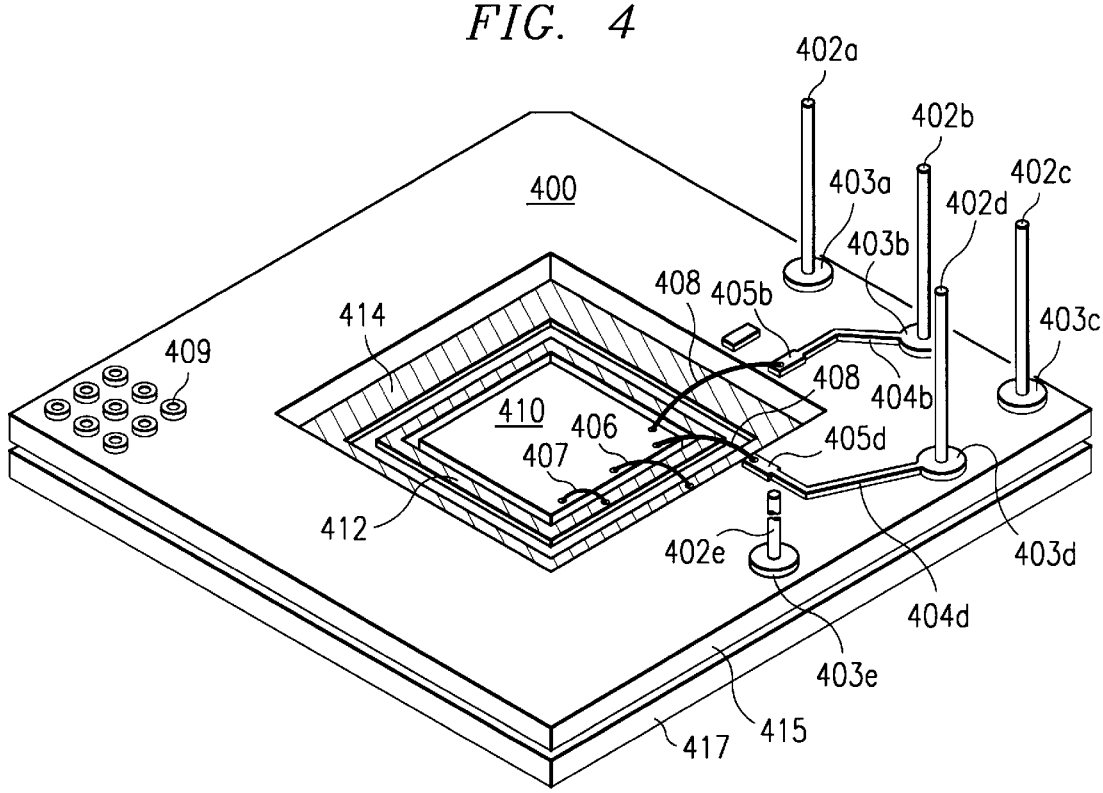
FIG. 4 is a diagram of a package formed in accordance with an illustrative embodiment of the present invention.

Turning now to FIG. 4, a diagram of a package formed in accordance with an illustrative embodiment of the present invention is depicted. Board 400 includes pins 402a–402e in holes 403a–403e with conduction paths 404b and 404d terminating at bonding pads 405b and 405d, which are connected to die 410, ground ring 412, or a power ring 414 by bond wire connections. Pin 402a is connected to the ground plane of PCB 417, while pin 402b connects bonding pad 405b on PCB 415. Pin 402c is connected to the ground plane of PCB 417; pin 402d connects bonding pad 405d on PCB 415. Pin 403e is connected to the power plane of PCB 417.

Bond wire 407 connects die 410 to ground ring 412, and bond wire 406 connects die 410 to power ring 414. Next, bond wires 408 provide connections between die 410 and signal layers in PCB 415 through the bonding pads 405b and 405d connected to pins 402b and 402d by conduction paths 404b and 404d. Via 409 connects the signal planes on the top and bottom side of PCB 415.

Figure 5:
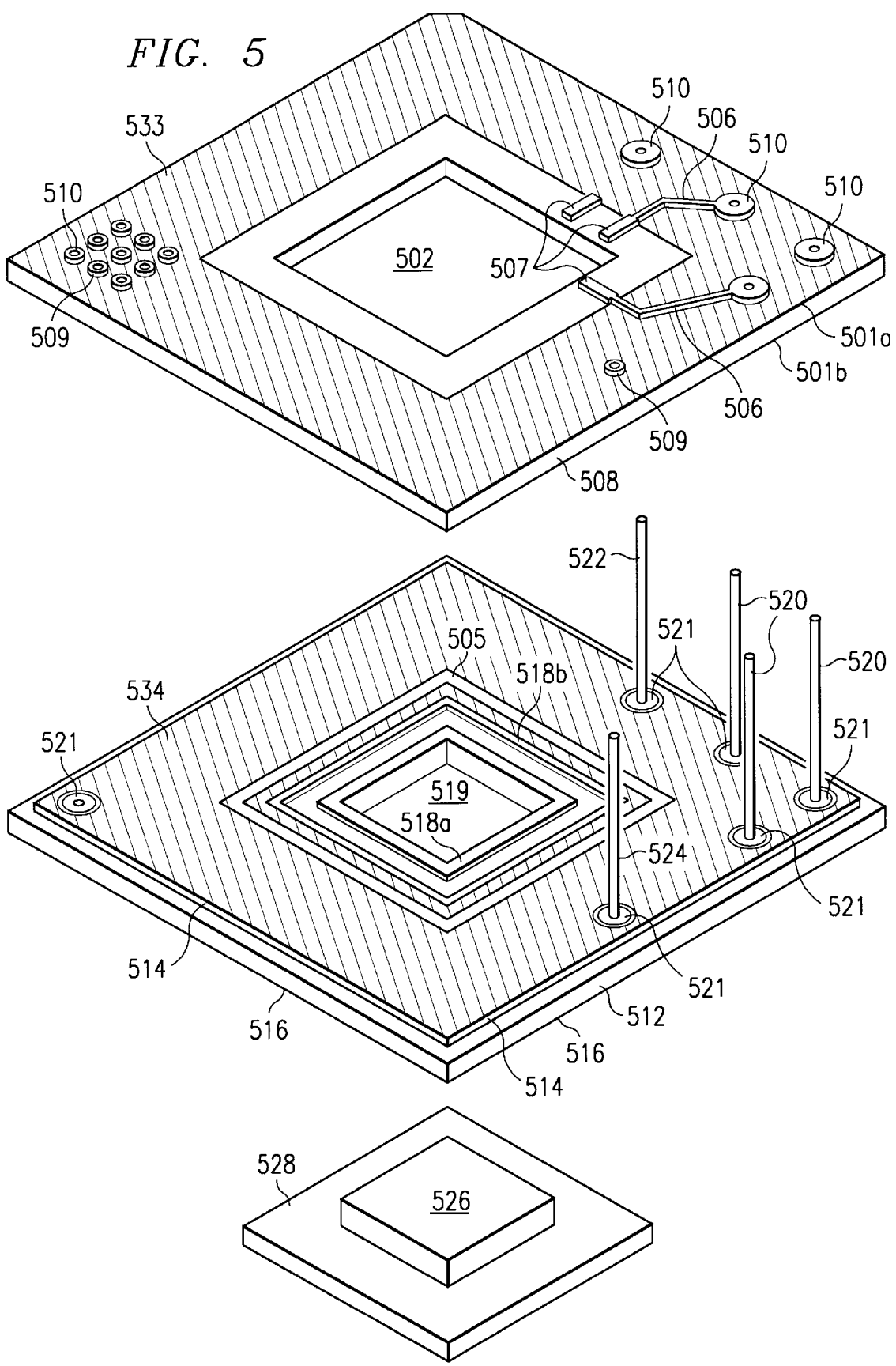
FIG. 5 is a diagram of components used to form the package shown in FIG. 4 in accordance with an illustrative embodiment of the present invention.

Turning next to FIG. 5, a diagram of components used to form package 400 are shown in accordance with an illustrative embodiment of the present invention. Board 500 has a hole 502 with a signal layer patterned to form conduction paths 506, which terminate in bonding pads 507. The conduction paths 506 and bonding pads 507 are formed under solder mask 533. Board 500 (PCB 415 in FIG. 4) also includes signal layers 501a and 501b with conduction paths (not shown). Board 512 (PCB 417 in FIG. 4) includes a power plane 514 and a ground plane 516. A ground ring 518a folds up within hole 519, and a power ring 518b is formed from power plane 514. Power ring 518b is formed by covering part of power plane 514 at a fixed distance from hole 519. The package includes signal pins 520 mounted in holes 521. Additionally, a ground pin 522 and a power pin 524 are illustrated in the depicted example. Die 526 with heat sink 528 are positioned such that die 526 fits within holes 502 and 520. Connections are made from the conduction paths to die 526 in bonding regions 507, 518a, and 518b. These bonding regions are defined in part by solder masks, such as solder mask 534.

Via 509 is used for pin insertion to join signal layers 501a and 501b on PCB 500, while vias 510 and 521 are employed for joining PCB 500 and 512. A groove 505 is formed in solder mask 534 for reducing outflow of adhesive.

Figure 6:
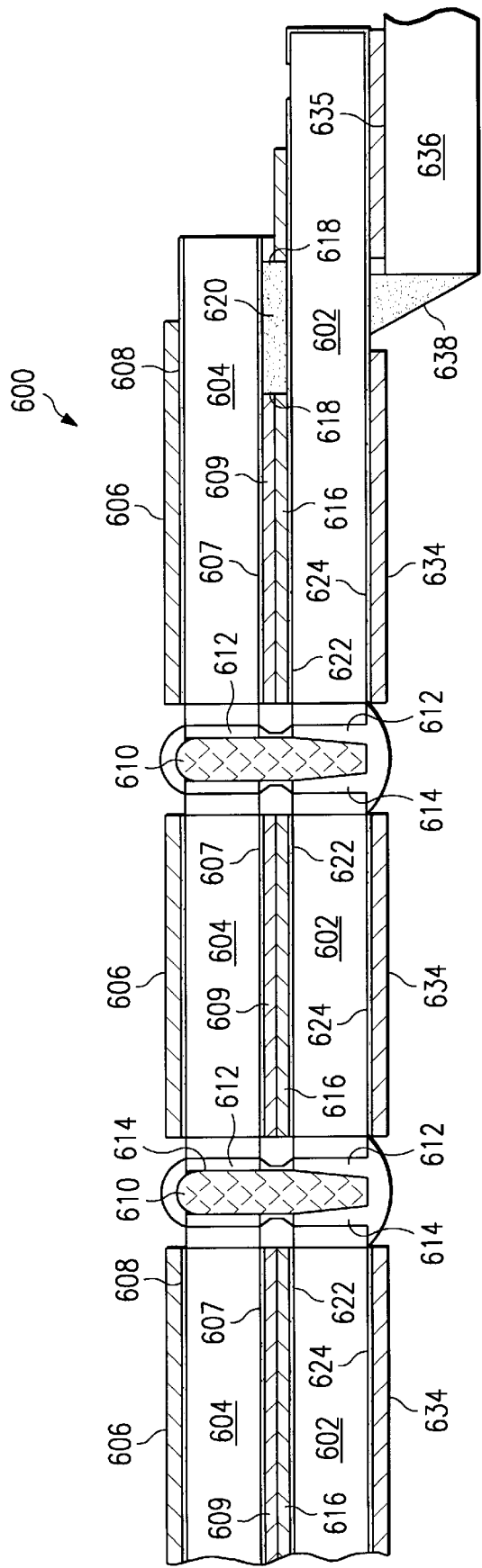
FIG. 6 is a partial cross-sectional view of a package depicted in accordance with an illustrative embodiment of the present invention.

Turning now to FIG. 6, a partial cross-sectional view of a package is depicted in accordance with an illustrative embodiment of the present invention. While FIG. 5 shows a long pin, this figure shows a short pin implementation. In the depicted example, package 600 includes a core 602 and a core 604. A solder mask 606 is formed over core 604. A signal layer 608 is also formed on core 604 under solder mask 606. A signal layer 607 is formed on the underside of core 604 with a solder mask 609 underneath signal layer 607. Package 600 also includes a pin 610 inserted and soldered inside vias 614 in cores 604 and 602, which provide connections between different layers of package 600. A solder mask 616 is formed on board 602 over power plane 622.

A groove 618 is formed in solder mask 616 and 609, which provides a structure to limit the flow of adhesive 620. The depicted example also includes a ground plane 624 associated with core 602. A solder mask 634 is formed on the bottom side of core 602 over ground plane 624. A solder mask 635 is located over heat sink 636 and connected to package 600 by solder 638. Groove 618 is in the form of a channel with straight sidewalls in the depicted example. Other shapes may be used to form groove 618 according to the present invention. Grooves are employed in areas where adhesive is to be applied to reduce spreading of adhesive when boards are coupled to each other.

Figure 7B:
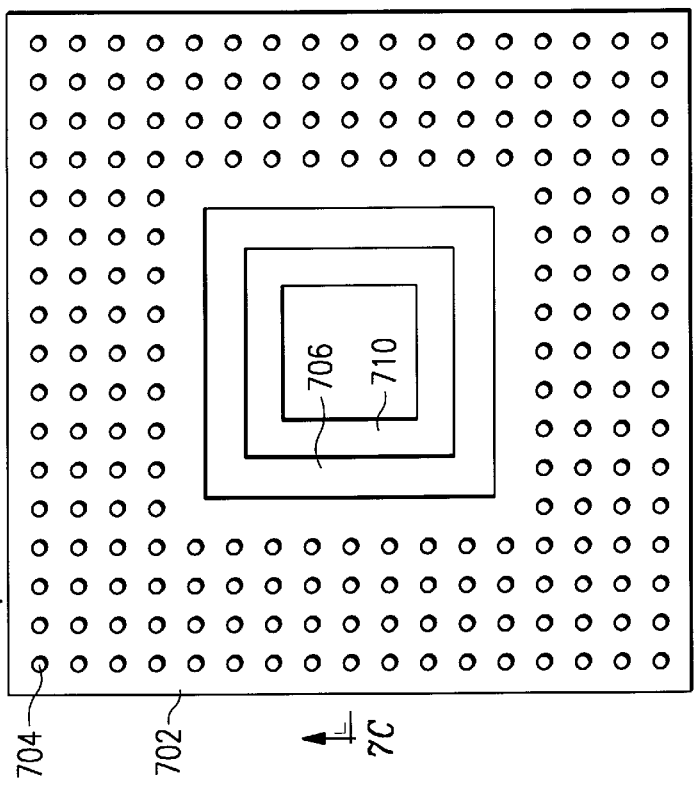
FIGS. 7A–7C are diagrams illustrating a process for aligning boards to form a package in accordance with an illustrative embodiment of the present invention.
Figure 7C:
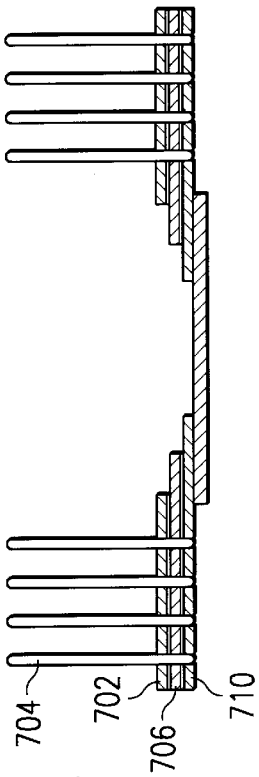
Figure 7A:
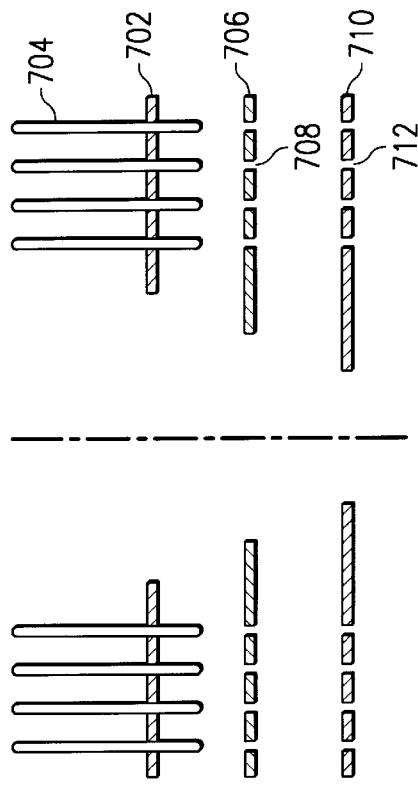

Turning now to FIGS. 7A–7C, diagrams illustrating a process for aligning boards to form a package 700 are depicted in accordance with an illustrative embodiment of the present invention. FIG. 7A is an exploded cross sectional view of package 700, and FIG. 7B is a top view of package 700. FIG. 7C illustrates a side cross-sectional view of package 700 assembled and connected to a heat sink 714. Pin base 702 includes a number of pins 704 placed within holes. Board 706 includes a number of holes 708 and board 710 includes a number of holes 712 lining up pins 704 with holes 708 and 712 provides alignment of pin base 702 with boards 706 and 710.

Thus, the present invention provides an improved method for creating packages for integrated circuit devices with multiple steps because the need for baking and clamping are avoided. The amount of adhesive required is reduced. Also, an adhesive other than prepreg may be used. For example, an adhesive called Ablebond 8700K manufactured by Ablestick Electronics, Materials and Adhesives, a subsidiary of National Starch and Chemical Co., 20021 Susana Road, Rancho Dominguez, Calif., 90221, may be used according to the present invention. The present invention provides this advantage because grooves are employed to reduce the outflow or spreading of adhesive into wire bonding regions. Also, the present invention decreases the amount of adhesive used because the areas requiring adhesive is reduced. According to the illustrative embodiment of the present invention, adhesive is placed between bonding shelves near regions where wire bonding is to occur. Adhesive could be placed in other areas but is not needed. The width of the groove is between about 1 to about 2 mm in the depicted example.

The manufacturer of the package can build the signal layers in a PWB line capable of fine geometries and the power/ground layers is a coarse geometry line. Also, this package can be re-configured by using a PCB with different signal planes. A large number of package configurations can be maintained by making multiple signal plane designs. These PCBs can be assembled by soldering at the final stage when a customer order is received. The power/ground planes can also be customized for the application such as having 5 volts and 3 volts on the same layer but different bonding fingers instead of the ring.

While the invention has been particularly shown and described with reference to a preferred embodiment, it will be understood by those skilled in the art that various changes in form and detail may be made therein without departing from the spirit and scope of the invention.

What is claimed is:

1. A method for forming a package for an integrated circuit comprising:

forming a plurality of conduction paths on a first board including a first hole and on a second board including a second hole larger than the first hole;

forming holes in the first board and in the second board, wherein the holes are adapted for receiving a plurality of pins;

aligning the holes;

coupling the first board to the second board using an adhesive to form two bond shelves, wherein the adhesive is located in areas where wire bonding is to occur; and attaching wires to the bond shelves on one end and to bond pads for an integrated circuit on another end to electrically connect conduction paths on the boards.

2. The method of claim 1, wherein the step of forming a plurality of conduction paths includes:

forming power and ground paths on the second board; and forming connection patterns on the first board.

3. The method of claim 1, wherein the step of forming holes in the first board comprises drilling holes in the first board and the second board.

4. The method of claim 1 further comprising forming holes for layer to layer connections within the same board, independent of holes on other boards.

5. The method of claim 1, wherein the first board is a single core, double-sided substrate.

6. The method of claim 1, wherein the second board is a single core, double-sided substrate.

7. The method of claim 1 further comprising coupling the integrated circuit to the package such that the integrated circuit is located within the first hole and second hole.

8. The method of claim 7, wherein the integrated circuit is a microprocessor.

9. The method of claim 7, wherein the integrated circuit is coupled to the package by mounting the integrated circuit on a heat sink attached to the package.

10. The method of claim 1 further comprising forming a groove in the first board, wherein the groove is located in regions above which wire bonding is used to electrically connect the integrated circuit to the package.

11. The method of claim 10 further comprising a groove in the second board, wherein the groove in the second board is located in regions below which wire bonding is employed to electrically connect the integrated circuit to the package.

12. A method for forming a package for an integrated circuit comprising:

etching connection patterns on a first board;

etching a power and a ground pattern on a second board;

drilling holes in the first board, wherein the holes are adapted for receiving pins and for layer to layer connections and at least a portion of the holes are used for alignment and form a first set of alignable holes;

patterning a groove in a region in the first board where wire bonding will occur, wherein the groove provides a guide for adhesive;

drilling holes in the second board, wherein the holes are adapted for receiving pins and for layer to layer connections, wherein at least a portion of the holes are alignable with the first set of alignable holes and forms a second set of alignable holes;

patterning a groove in a region in the second board where wire bonding will occur, wherein the groove provides a guide for adhesive;

placing adhesive in the at least one groove;

aligning the first board with the second board using the first set of alignable holes and the second set of alignable holes; and coupling the first board to the second board using the adhesive.

13. The method of claim 12, wherein the step of aligning comprising:

placing pins in the holes adapted to receive the pins in the first board; and aligning the second board with the first board by lining up the holes in the second board adapted for receiving pins with the pins in the first board.

14. The method of claim 13, wherein the steps of placing pins and aligning the second board are performed using a pin base having multiple pins.

15. The method of claim 12, wherein the at least one groove has a width from about 1 mm to about 2 mm.

16. The method of claim 11, wherein the first board includes signal layers.

17. The method of claim 12, wherein the second board includes a power plane and a ground plane.

18. The method of claim 12, wherein the adhesive is Ablebond 8700K.

19. The method of claim 12, wherein the adhesive is prepreg.

* * * * *